United States Patent

Matsuura et al.

[11] Patent Number: 5,955,779
[45] Date of Patent: Sep. 21, 1999

[54] METHOD OF FORMING RESIN FILM OF DESIRED PATTERN ON SEMICONDUCTOR SUBSTRATE, SEMICONDUCTOR CHIP, SEMICONDUCTOR PACKAGE, AND RESIST IMAGE REMOVER

[75] Inventors: Hidekazu Matsuura, Oyama; Yoshihide Iwazaki, Tsukuba, both of Japan

[73] Assignee: Hitachi Chemical Company, Ltd., Tokyo, Japan

[21] Appl. No.: 08/906,359

[22] Filed: Aug. 5, 1997

Related U.S. Application Data

[63] Continuation of application No. 08/448,208, May 23, 1995, abandoned.

[30] Foreign Application Priority Data

May 24, 1994 [JP] Japan ..................................... 6-109474

[51] Int. Cl.⁶ .......................... H01L 23/02; H01L 23/495; H01L 23/58; H01L 23/29
[52] U.S. Cl. .......................... 257/678; 257/668; 257/642; 257/643; 257/792
[58] Field of Search .................................... 257/668, 642, 257/643, 678, 792; 437/225

[56] References Cited

U.S. PATENT DOCUMENTS

| | | | |
|---|---|---|---|
| 3,838,984 | 10/1974 | Crane et al. | 257/668 |
| 3,868,724 | 2/1975 | Perrino | 257/668 |
| 4,165,294 | 8/1979 | Vander Mey | 252/143 |
| 4,624,909 | 11/1986 | Saotome et al. | 430/192 |
| 4,733,289 | 3/1988 | Tsurumaru | 257/643 |
| 5,430,329 | 7/1995 | Harada et al. | 257/642 |

FOREIGN PATENT DOCUMENTS

| | | |
|---|---|---|
| 53-53401 | 5/1978 | Japan . |
| 5-218008 | 8/1993 | Japan . |

*Primary Examiner*—Teresa M. Arroyo
*Attorney, Agent, or Firm*—Pennie & Edmonds LLP

[57] ABSTRACT

A method of forming a resin film pattern, comprising the steps of (A) producing a resin film layer soluble in an organic solvent, on a substrate such as silicon wafer, even engineering plastics being usable as a resin of the resin film layer; (B) forming a resist image of desired pattern on the organic solvent-soluble resin film layer; (C) etching each of those parts of the organic solvent-soluble resin film layer which are not covered with the resist image, using the organic solvent; and (D) removing the resist image from the resulting, organic solvent-soluble resin film layer using a resist image remover which contains 0.01–10.0 parts-by-weight of arylsulfonic acid with respect to 100 parts-by-weight of solvent having a solubility parameter of 5.0–11.0. The step (D) may well be followed by the step (E) of processing the substrate which includes the resin film layer, with alcohol.

3 Claims, 3 Drawing Sheets

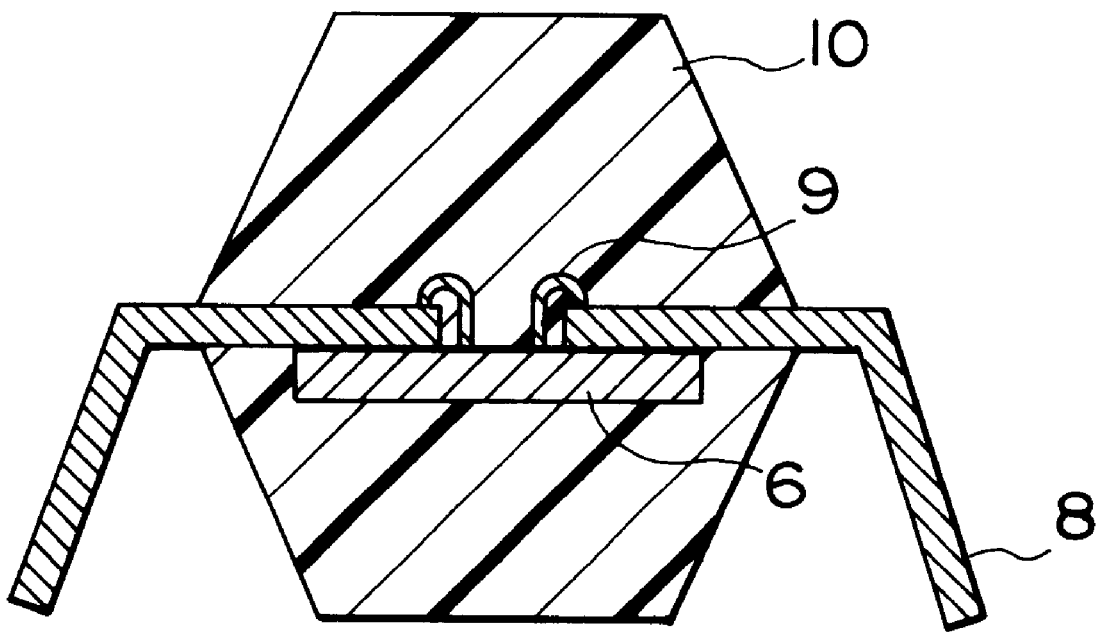

METHOD OF FORMING RESIN FILM OF DESIRED PATTERN ON SEMICONDUCTOR SUBSTRATE, SEMICONDUCTOR CHIP, SEMICONDUCTOR PACKAGE, AND RESIST IMAGE REMOVER

This is a continuation of application Ser. No. 08/448,208, filed May 23, 1995, now abandoned.

BACKGROUND OF THE INVENTION

1. Field of the Invention

The present invention relates to a method of forming a resin film in a desired pattern on a semiconductor substrate. It also relates to a semiconductor chip, a semiconductor package and a resist image remover.

2. Description of the Related Art

Heretofore, a specified polyimide resin has been employed as the resin of a resin film pattern. A semiconductor chip is produced in such a manner that; on a substrate, such as a silicon (Si) wafer, a gallium arsenide (GaAs) wafer, circuit elements are produced; the circuit elements are components, such as transistor, diode, resistance, capacitor, which constitute an electronic circuit; then, an inorganic insulator film made of any of $SiO_2$ (silicon dioxide), $Si_3N_4$ (Silicon nitride), PSG (phosphosilicate glass) etc., and metal wiring made of, for example aluminum, are formed so as to form a semiconductor substrate; further, for protecting a surface other than electrode parts to be external terminal for wiring, an insulator resin film is formed.

In this specification, the insulator resin film which protects a surface other than electrode parts on the semiconductor substrate calls a "resin film pattern".

It is known that the resin film pattern made of the specified polyimide resin is formed as stated below. Polyamic acid which is the precursor of the polyimide resin is dissolved in an organic solvent, and the semiconductor substrate of the silicon chip or the like is coated with the resulting solution. Thereafter, the substrate coated with the solution is processed by a method (a) wherein the substrate is heat-treated at 220–350 (° C.), a resist image is subsequently formed on a resin film layer produced by the heat treatment, the resulting resin film is subsequently etched and removed with a hydrazine-based solution, and the resist image is finally removed from the resin film with a remover liquid of organic solvent type containing a phenolic compound (refer to, for example, the official gazette of Japanese Patent Application Laid-open No. 53401/1978), or by a method (b) wherein the substrate is heat-treated at 110–160 (° C.), a resin film layer produced by the heat treatment is subsequently coated with a resist, the resist is subsequently exposed to light through a mask of a desired pattern (the non-exposed parts are to be a resist image), both the exposed parts of the resist and the underlying parts of the resin film are subsequently etched and removed with an alkaline aqueous solution, and the resulting resist image is finally removed from the resin film with a resist-image remover liquid which contains butyl acetate or any of cellosolves as a solvent (refer to, for example, the official gazette of Japanese Patent Application Laid-open No. 218008/1993).

The method (a) has the disadvantage that the harmful hydrazine-based solution (as an etchant) and the organic solvent containing the phenolic compound (as the resist-image remover liquid) are consumed in large quantities. On the other hand, the method (b) has the advantages of a simpler process etc. because the resist and the resin film can be simultaneously etched and removed. As compared with the method (a), accordingly, the method (b) is mainly applied at present.

The method (b), however, has the difficulty that the alkali employed as an etchant for resin film layer corrodes the aluminum wiring of the semiconductor substrate. It is therefore desired to develop a method which does not employ any alkali as the etchant, that is the method which employs organic solvent as the etchant.

Meanwhile, regarding the resin film pattern which is formed on the surface of the semiconductor substrate, it is demanded to lower the temperature for forming the resin film and to improve the characteristics of the resin film pattern, such as the heat resistance property, electric characteristics and hygroscopic property thereof. In view of these demands, it is also desired to develop a method in which polyimides or polyamides exhibiting superior solubilities in organic solvents, or engineering plastics such as polysulfone can be extensively used instead of the specified polyimide resin which is insoluble in organic solvents, having hitherto been employed.

Nevertheless, in the case where any of the resins of the superior solubilities in the organic solvent is used as the resin of the resin film pattern and where an organic solvent is used as the etchant, the resin used is dissolved in the organic solvent of either of the resist-image remover liquids employed in the methods (a) and (b), and hence, the resin film pattern cannot be formed.

SUMMARY OF THE INVENTION

The present invention has for its first object to provide a method of forming a resin film pattern on a semiconductor substrate, the method employing an organic solvent (employing no alkali) as an etchant, in which metal wiring made of aluminum etc. is secure from corrosion, and in which other engineering plastics exhibiting higher solubilities in organic solvents can be extensively used in addition to the conventional polyimide resin.

The second object of the present invention is to provide a method of manufacturing a semiconductor chip and/or a semiconductor package, in which the resin film pattern is formed by the method of the first object.

The third object of the present invention is to provide a resist image remover which is adopted in the methods of the first and second objects.

The first aspect of performance of the present invention consists in methods of forming a resin film pattern on a semiconductor substrate as stated in the following items (1)–(6):

(1) A method of forming a resin film of desired pattern on a semiconductor substrate, comprising the steps of:
   (A) forming a resin film layer soluble in an organic solvent, on the semiconductor substrate;
   (B) forming a resist image of desired pattern on the organic solvent-soluble resin film layer;
   (C) etching and removing each of those parts of the organic solvent-soluble resin film layer which are not covered with the resist image, using the organic solvent; and
   (D) removing the resist image from the resulting, organic solvent-soluble resin film layer with a resist image remover.

(2) A method as defined in the above item (1), further comprising the step of:
   (E) processing the semiconductor substrate which includes the resin film layer, using alcohol, after the step (D).

(3) A method as defined in either of the above item (1), wherein the resist image remover contains 0.01–10.0 parts-by-weight of arylsulfonic acid with respect to 100 parts-by-weight of solvent which has a solubility parameter of 5.0–11.0.

(4) A method as defined in the above item (3), wherein the arylsulfonic acid includes at least one member selected from the group consisting of benzenesulfonic acid, toluenesulfonic acid, xylenesulfonic acid, ethylbenzenesulfonic acid and propylbenzenesulfonic acid.

(5) A method as defined in the above item (3), wherein the solvent having the solubility parameter of 5.0–11.0 includes at least one member selected from the group consisting of xylene, cyclohexane, toluene and benzene.

(6) A method as defined in any of the above item (1), wherein a resin of the organic solvent-soluble resin film layer is polyimide resin.

Further, the second aspect of performance of the present invention, a semiconductor chip is provided which comprises a resin film of desired pattern which is formed on the semiconductor substrate by the method as defined in item (1).

The third aspect of performance of the present invention, a semiconductor package is provided which is formed by connecting an electrode of the mentioned semiconductor chip with a lead frame, and being encapsulated with a mold resin.

Still further, the fourth aspect of performance of the present invention consists in resist image removers as stated in the following items (i)–(iv):

(i) A resist image remover comprising arylsulfonic acid, and a solvent which has a solubility parameter of 5.0 –11.0, the arylsulfonic acid being contained at 0.01–10.0 parts by weight with respect to 100 parts-by-weight of the solvent.

(ii) A resist image remover as defined in the above item (i), wherein the arylsulfonic acid includes at least one member selected from the group consisting of benzenesulfonic acid, toluenesulfonic acid, xylenesulfonic acid, ethylbenzenesulfonic acid and propylbenzenesulfonic acid.

(iii) A resist image remover as defined in the above item (i), wherein the solvent having the solubility parameter of 5.0–11.0 is a solvent which includes at least one member selected from the group consisting of xylene, cyclohexane, toluene and benzene.

(iv) A resist image remover as defined in the above item (i), wherein the arylsulfonic acid includes at least one member selected from the group consisting of benzenesulfonic acid, toluenesulfonic acid, xylenesulfonic acid, ethylbenzenesulfonic acid and propylbenzenesulfonic acid, while the solvent having the solubility parameter of 5.0–11.0 includes at least one member selected from the group consisting of xylene, cyclohexane, toluene and benzene.

BRIEF DESCRIPTION OF THE DRAWINGS:

FIGS. 1A thru 1D are sectional views for explaining respective typical steps in a process for forming a resin film pattern in accordance with the present invention, wherein:

FIG. 1A shows that state of a semiconductor chip in which a resin film layer (4) has been formed. The semiconductor chip is formed by an aluminium wiring (3) and an inorganic insulator film layer (2) formed on a silicon wafer (1) on which a circuit element (1') is produced.

FIG. 1B shows the state thereof in which a resist image of desired pattern (5) has been formed on the resin film layer (4);

FIG. 1C shows the state thereof in which the resin film layer (4) has been etched with an organic solvent; and FIG. 1D shows the state thereof in which the resist image (5) has been removed with a resist image remover.

FIG. 5 is a schematic sectional view showing yet another example of the semiconductor package of the present invention, in which a semiconductor chip (6) and a lead frame (8) are bonded by utilizing the resin film pattern on the semiconductor chip (6) as a binder, without employing a binder (7) in the example shown in FIG. 2.

DETAILED DESCRIPTION OF THE INVENTION

FIGS. 1A thru 1D of the accompanying drawing are schematic sectional views showing respective typical steps in the method of forming the resin film pattern on the semiconductor substrate in accordance with the present invention.

Figure 1A:
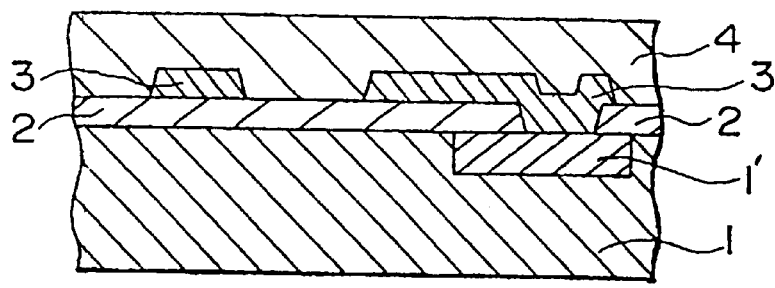

In these figures, FIG. 1A shows the state in which a resin film layer (4) has been formed on a semiconductor chip. The semiconductor chip is formed by an aluminium wiring (3) and an inorganic insulator film layer (2) formed on a silicon wafer (1) on which a circuit element (1') is produced.

Figure 1B:
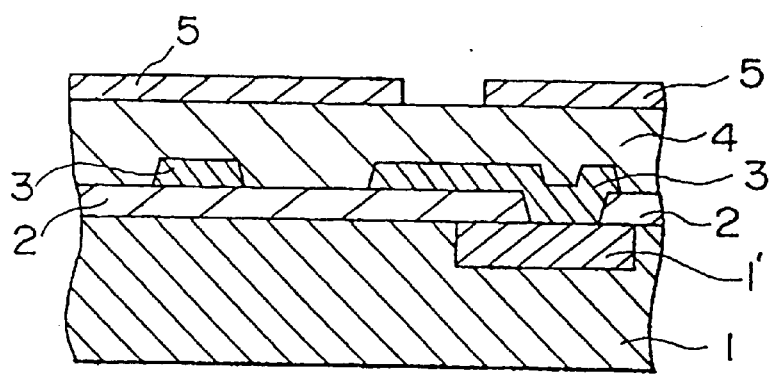

Besides, FIG. 1B shows the state in which the resist image of desired pattern (5) has been formed on the resin film layer (4).

Figure 1C:
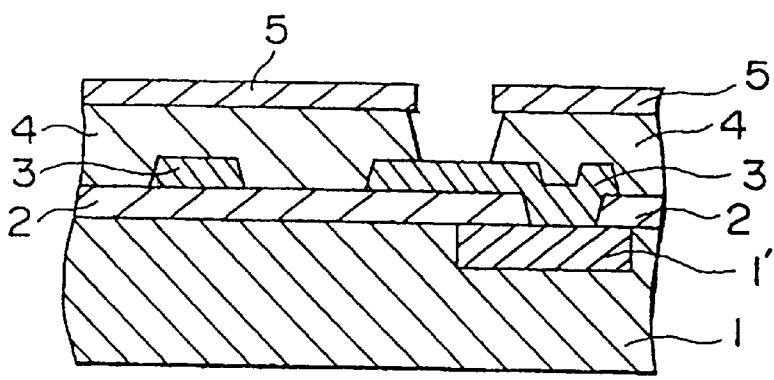

Further, FIG. 1C shows the state in which the part of the resin film layer (4) not covered with the resist image (5) has been etched and removed with the organic solvent.

Figure 1D:
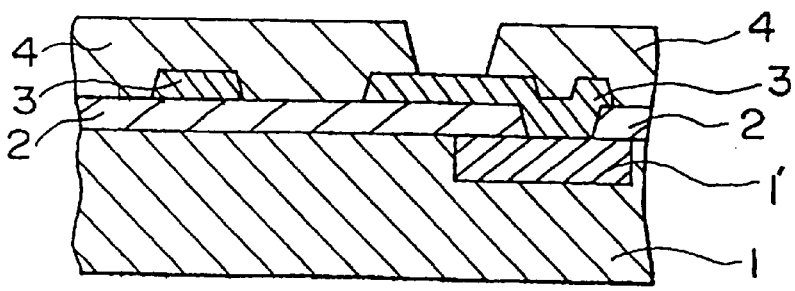

Lastly, FIG. 1D shows the state in which the resist image (5) has been removed with the resist image remover.

In the present invention, a resin film pattern is formed on a semiconductor substrate. The semiconductor substrate is formed in such a manner that; on a substrate, such as a silicon (Si) wafer, a gallium arsenide (GaAs) wafer, circuit elements are produced; the circuit elements are components, such as transistor, diode, resistance, capacitor, which constitute an electronic circuit; besides, an inorganic insulator film made of any of $SiO_2$ (silicon dioxide), $Si_3N_4$ (silicon nitride), PSG (phosphosilicate glass), etc. and metal wiring made of a metal such as aluminum is formed on the resulting substrate. The semiconductor substrate includes IC (integrated circuit), LSI (large scale integrated circuit), and VLSI (very large scale integrated circuit).

A resin film layer which is soluble in an organic solvent, can be produced on the semiconductor substrate in the following way: A resin varnish is applied onto the substrate by, for example, spin coating, a coating method wherein an applicator or a doctor blade is employed, or a method wherein the substrate is immersed in the resin varnish and is subsequently pulled up therefrom. Thereafter, the substrate bearing the resulting resin layer soluble in the organic solvent is heated to evaporate off the organic solvent contained in the resin layer. Then, the resin film layer is prepared.

That resin of the resin film layer soluble in the organic solvent which is to be used in the present invention is not specifically restricted as long as the resin is soluble in the organic solvent. Usable are, for example, engineering plastics such as heat-resisting resins such as polyimide and polyamide, polysulfone, polyether sulfone, polyphenylene sulfide, polyetheretherketone and polyarylate. Among them, the polyimide or polyamide is preferable, and the polyimide is especially preferable.

In a case where the polyimide is used, it may be either closed-ring polyimide or polyamic acid which is the precursor of the former. Here, the "polyimide" shall include any resin having an imido-group, such as polyamide imide, polyester imide or polyether imide.

In the present invention, an expression "resist image" is intended to mean a layer made of a material which is not corroded by an etchant, in other words, which is etch-resistant.

There are various methods for forming the resist image of desired pattern on the resin film layer which is soluble in the organic solvent, and which overlies the semiconductor substrate. Ordinarily, the resist image of the desired pattern is formed in such a way that the layer of the material for forming the resist image (in this specification, the material shall also be simply termed the "resist") is produced on the resin film layer soluble in the organic solvent, that the produced resist layer is exposed to light through a photomask of desired pattern, and that the exposed resist layer is processed with a developing solution.

It is required that the resist image forming material endure the organic solvent of the etchant. The resist may be in any of the forms of a solution, a paste or a film. Such resists include photoresist etc. in addition to thermosetting or photosensitive resist ink, and they may be of either the negative type or the positive type. Preferable are the negative type resists of chlorinated polymethyl styrene, polyvinyl cinnamate, polyester acrylate, polyepoxy acrylate, polyurethane acrylate, a mixed system consisting of polyepoxy and an onium salt, a mixed system consisting of polyvinyl phenol and bis-azide, a mixed system consisting of bis-azide and polycinnamic acid or cyclized rubber, and a mixed system consisting of a novolak resin, diazo-naphthoquinone and hexamethoxymethyl melamine. More preferable is the negative type photoresist of a mixed system consisting of rubber and bis-azide.

Besides, in order to develop the resist image subjected to the exposure, any appropriate developing solution is selected in accordance with the type of resist employed.

The organic solvent for etching the organic solvent-soluble resin film layer is not specifically restricted as long as the resin film can be dissolved. It is appropriately selected depending upon the type of organic solvent-soluble resin employed. Such organic solvents include, for example, N-methylpyrrolidone, N,N-dimethylformamide and dimethylacetamide. Using any of the organic solvents, those parts of the resin film layer which are not covered with the resist image are etched and removed.

By the way, in a case where the development of the exposed resist image and the etching of the resin film layer can be carried out with an identical organic solvent, they may well be simultaneously carried out.

A resist image remover to be described later is employed in the method of the present invention for forming the resin film pattern.

The removal of the resist image with the resist image remover can be effected, for example, in such a way that the substrate including the resist image and the resin film is immersed in the remover, or that the remover is sprayed onto the substrate. At this time, an ultrasonic wave may well be conjointly used. A temperature for the processing of the immersion, the spraying or the like is not specifically restricted as long as an organic solvent in the resist image remover employed is maintained in its liquid form. Usually, it lies within a temperature range from room temperature to a temperature lower than the boiling point of the solvent of the resist image remover. A time period for the processing of the immersion, the spraying or the like is set sufficient to remove the resist image from the resin film. Usually, it is several seconds to several hours.

When the above processing of the immersion, the spraying or the like is followed by such processing as immersing the resulting substrate in an appropriate alcoholic solvent or spraying the alcoholic solvent onto the resulting substrate, the resist image can be completely removed from the resin film with ease.

Mentioned as the appropriate alcoholic solvents here are methanol, ethanol, propanol, isopropanol, butanol, methyl cellosolve, cellosolve, butyl cellosolve, etc.

A temperature for the processing with the alcoholic solvent on this occasion is not specifically restricted as long as the solvent employed is maintained as a liquid. Usually, however, the processing temperature is room temperature. A time period for the immersion is set sufficient to completely separate the resist image from the resin film, and it is usually several seconds to several hours. Although the resist image can also be removed by rubbing it with a brush or the like instead of the immersion, the rubbing operation is unsuited to mass processing.

After the processing with the resist image remover or the subsequent processing with the alcohol, the resulting substrate is dried at room temperature or by heating. Then, a semiconductor chip being formed with the resin film pattern is obtained.

Now, the resist image remover according to the present invention will be described.

The resist image remover is a solution in which 0.01–10.0 parts-by-weight of arylsulfonic acid being a removal assistant are contained with respect to 100 parts-by-weight of solvent, and in which the solvent has a solubility parameter of 5.0–11.0.

Mentioned as the arylsulfonic acids are, for example, benzenesulfonic acid, toluenesulfonic acid, xylenesulfonic acid, ethylbenzenesulfonic acid, propylbenzenesulfonic acid, hexylbenzenesulfonic acid, octylbenzenesulfonic acid, decylbenzenesulfonic acid and dodecylbenzenesulfonic acid. Preferable among them are the benzenesulfonic acid, toluenesulfonic acid, xylenesulfonic acid, ethylbenzenesulfonic acid and propylbenzenesulfonic acid. Especially preferable is the toluenesulfonic acid.

The content of the arylsulfonic acid amounts to 0.01–10.0 parts-by-weight, preferably to 0.01–5.0 parts-by-weight, more preferably to 0.05–3.0 parts-by-weight, and especially preferably to 0.1–1.0 parts-by-weight, with respect to 100 parts-by-weight of the organic solvent of the resist image remover. In a case where the content exceeds 10.0 parts by weight, the resist image remover comes to exhibit a strongly acidic property upon absorbing water, and it might corrode the metal. On the other hand, in a case where the content is less than 0.01 parts-by-weight, the removing power of the resist image remover is lowered.

The resist image remover features that the concentration of the arylsulfonic acid contained therein may be considerably lower than in the conventional resist image remover without degrading the removing power.

Regarding the organic solvent which is employed as the solvent of the resist image remover of the present invention, a favorable one is selected from among organic solvents which do not corrode the resin film layer produced on the semiconductor substrate. Such an organic solvent is a single solvent which has a preferable solubility parameter of 5.0–11.0, or a mixed solvent which is mixed so as to have the preferable solubility parameter of 5.0–11.0. Since the preferable range of the solubility parameter fluctuates depending upon the type of organic solvent-soluble resin employed, it is appropriately selected in accordance with the type of resin.

In the case where the organic solvent-soluble resin used is the polyimide resin, the solubility parameter of the organic solvent as the solvent of the resist image remover should preferably be 5.0–11.0, more preferably 6.0–10.0, and especially preferably 6.5–10.0. The organic solvents satisfying such a requisite include, for example, xylene (exhibiting a solubility parameter of 8.8), cyclohexane (exhibiting a solubility parameter of 8.3), benzene (exhibiting a solubility parameter of 9.2), toluene (exhibiting a solubility parameter of 8.9), and a mixed solution which contains at least one of the preceding solvents. Among them, the xylene, the cyclohexane, and a mixed solution containing either or both of the preceding solvents are more preferable.

Incidentally, the solubility parameter is also called "solubility coefficient", and it is that characteristic value of a liquid which is given by the square root of E/V (where E denotes the molecule aggregation energy of the liquid, and V the molecular volume thereof). Besides, in this specification, the solubility parameter of the mixed solution shall be calculated in terms of the sum of products which are obtained by multiplying the solubility parameters of the respective organic solvents by the weight percentages thereof.

When the solubility parameter of the organic solvent for use in the resist image remover is either less than 5.0 or greater than 11.0, it becomes difficult to remove the resist image from the resin film.

In a case where the arylsulfonic acid is difficult to dissolve by the solvent of the resist image remover, another organic solvent which is well adapted to dissolve the arylsulfonic acid may well be added to the extent that the resin is not corroded and that the combined solubility parameter of the solvents does not fall outside the range of 5.0–11.0.

The resist image remover according to the present invention is a new composite. This resist image remover makes it possible to provide a method of forming a resin film pattern on a semiconductor substrate, in which an organic solvent is employed as an etchant without employing any alkali, and in which other resins exhibiting higher solubilities in organic solvents can be used in addition to the conventional polyimide resin. Moreover, the application of the method makes it possible to provide a semiconductor chip and/or a semiconductor package of high reliability.

The resist image remover of the present invention, however, does not have its use restricted to only the resin film pattern which is formed on the semiconductor substrate. When combined with the resins of the superior, organic solvent-solubilities as mentioned before and with general organic solvents to serve as etchants, the resist image remover of the present invention is also useful in cases of forming resin film patterns for the protection, insulation, bonding, etc. of the surfaces of wiring layers, etc. on various substrates, for example, metal plates made of Cu, Fe, Al, 42 alloy, etc., ceramic substrates such as a glass substrate, an alumina substrate and a silicon nitride substrate, and substrates for wiring boards such as a glass epoxy substrate, a paper phenol substrate and a glass polyimide substrate.

A semiconductor package can be produced with a semiconductor chip with a resin film pattern which is formed by any methods of described above. Examples of the semiconductor package are illustrated in schematic sectional views of FIGS. 2 thru 5. The semiconductor chip (6) with the resin film pattern as shown in each of FIGS. 2 –5 corresponds to the structure shown in FIG. 1D.

The semiconductor package according to the present invention, as shown in FIGS. 2 to 5, can be manufactured in such a way that semiconductor chip (6) with the resin film pattern is bonded with a lead frame (8), then electrodes included in the semiconductor chip (6) are connected with leads of the lead frame (8) through pieces of wire (9) of gold or the like (by wire bonding), whereupon the resulting semiconductor chip (6), the bonded parts of the semiconductor chip (6) and the lead frame (8) and wire-connected parts are encapsulated with a mold resin (10). As to a binder for bonding the semiconductor chip (6) with the lead frame (8), resin used for a resin film pattern formed on the semiconductor substrate can be used simultaneously. Further, another binder (7) such as adhesive tape or the like may be used. The mold resin (10) to be employed should desirably be one which is favorable especially in moisture-resistance.

Figure 2:
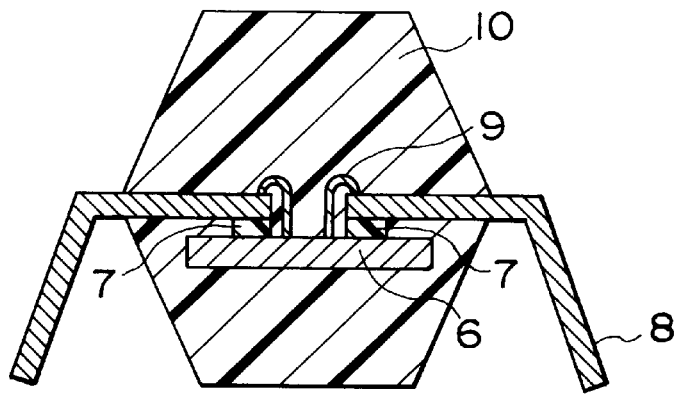
FIG. 2 is a schematic sectional view showing an example of a semiconductor package according to the present invention, in which a semiconductor chip (6) lies below a lead frame (8)
Figure 3:
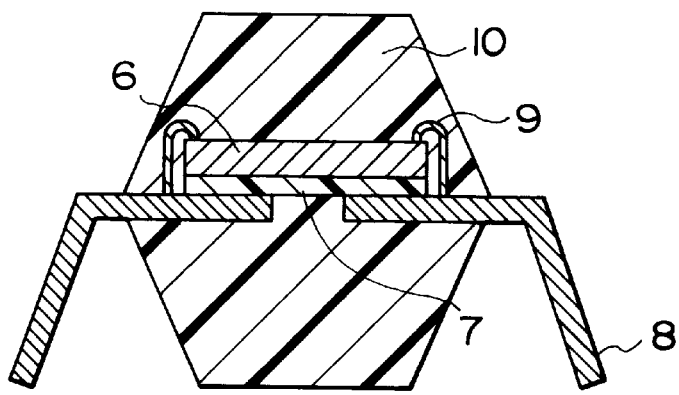
FIG. 3 is a schematic sectional view showing another example of the semiconductor package of the present invention, in which a semiconductor chip (6) lies above a lead frame (8)
Figure 4:
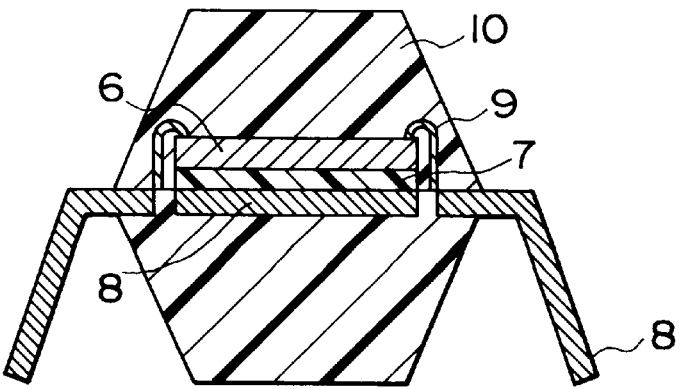
FIG. 4 is a schematic sectional view showing still another example of the semiconductor package of the present invention, in which a semiconductor chip (6) lies above a lead frame (8)

FIG. 2 shows the semiconductor package in which the semiconductor chip (6) lies below the lead frame (8), FIG. 3 shows the semiconductor package in which the semiconductor chip (6) lies above the lead frame (8), and FIG. 4 shows the semiconductor package in which the semiconductor chip (6) lies above the lead frame (8).

Incidentally, the semiconductor package can also be manufactured in such a way that the binder (7) in the semiconductor package shown in FIG. 2 is not employed, but that the resin film pattern on the semiconductor chip (6) is also used as a binder, with which the semiconductor chip (6) and the lead frame (8) are bonded. The semiconductor package thus fabricated is exemplified in FIG. 5.

In FIGS. 2–5, numeral 9 designates the wire piece of the wire bonding, and numeral 10 designates the mold resin.

The present invention will now be concretely described in connection with examples.

EXAMPLE 1

A varnish of N-methylpyrrolidone being a polyamideimide, which was made from trimellitic acid anhydride and 2,2-bis[4-(4-aminophenoxy) phenyl] propane (BAPP), was applied onto a semiconductor substrate (silicon wafer is used as a substrate), by spin coating, so as to have a thickness of 20 ($\mu$m) after drying. It was dried at 100 (° C.) for 30 (minutes).

A negative type photoresist "OMR-85" (produced by Tokyo Ōka Kōgyō Kabushiki-Kaisha) was applied onto the dried polyamideimide film by spin coating so as to have a thickness of 1 ($\mu$m) after drying. It was dried at 90 (° C.) for 20 (minutes) into a resist film.

The resist film was exposed to light with a photo-mask of linear pattern placed thereon. The exposed resist film was developed with an OMR developing solution "SL" (produced by Tokyo Ōka Kōgyō Kabushiki-Kaisha), was rinsed with an OMR rinsing liquid (produced by Tokyo Ōka Kōgyō Kabushiki-Kaisha) and washed with pure water. The washed resist film dried at 140 (° C.) for 20 (minutes). Thus, a resist image was formed.

N-methylpyrrolidone was employed as an etchant, and the resulting silicon wafer was immersed therein at 50 (° C.) for 5 (minutes). Thereafter, the silicon wafer was subjected to rotary drying. Further, it was dried at 100 (° C.) for 30 (minutes). A solution of xylene (solubility parameter: 8.8) containing 0.5 parts-by-weight of para-toluenesulfonic acid with respect to 100 parts-by-weight of xylene was employed as a resist image remover, and the dried silicon wafer was immersed therein at 80 (° C.) for 10 (minutes). Thereafter, the silicon wafer was immersed in isopropanol at room temperature for 30 (seconds), whereby the removing of the resist image was completed. Subsequently, the resulting silicon wafer was dried at 200 (° C.) for 30 (minutes) so as to remove the remaining solvents. When the polyamideimide film was observed, it bore a pattern conforming exactly to the photo-mask. Besides, no roughening of the surface of the resin, or thinning of the resin film, etc. were noted that could be attributed to the resist image remover.

EXAMPLE 2

The resin film pattern was formed on the semiconductor substrate (silicon wafer is used as the substrate) in the same way as in Example 1, except for a resist image remover which was prepared by dissolving 3 parts-by-weight of para-toluenesulfonic acid into a mixed solution (solubility parameter: 9.5) that consisted of 25 parts-by-weight of methyl cellosolve (solubility parameter: 11.4) for assisting the dissolution and 75 parts-by-weight of xylene (solubility parameter: 8.8). The pattern of the polyamideimide film was formed conforming exactly to the photo-mask. Besides, no roughening of the surface of the resin, or thinning of the resin film, etc. were noted that could attributed to the resist image remover.

EXAMPLE 3

A varnish of N-methylpyrrolidone, being a polyimide, which was made from bisphenol-A bistrimellitate dianhydride (BABT) and 4,4'-diamino-3,3',5,5'-tetraethyl diphenylmethane (TEDDM), was applied onto the semiconductor substrate (silicon wafer is used as the substrate), to a thickness of 10 ($\mu$m) by spin coating. Thereafter, it was dried at 100 (° C.) for 30 (minutes).

A negative type photoresist "OMR-83" (produced by Tokyo Ōka Kōgyō Kabushiki-Kaisha) was applied onto the dried polyimide film to a thickness of 1 ($\mu$m) by spin coating. Thereafter, it was dried at 90 (° C.) for 20 (minutes) into a resist film.

The resist film was exposed to light with a photo-mask of linear pattern placed thereon. Subsequently, the exposed resist film was developed with an OMR developing solution "SL", rinsed with an OMR rinsing liquid and washed with pure water. Thereafter, the washed resist film was dried at 140 (° C.) for 20 (minutes). Thus, a resist image was formed.

N,N-dimethylformamide was employed as an etchant, and the resulting silicon wafer was immersed therein at 30 (° C.) for 5 (minutes). Thereafter, the silicon wafer was dried at 100 (° C.) for 30 (minutes). A resist image remover was prepared by dissolving 0.5 parts-by-weight of para-toluenesulfonic acid into 100 parts-by-weight of mixed solution (solubility parameter: 8.6) in which cyclohexane (solubility parameter: 8.3) and isopropanol (solubility parameter: 11.5) were contained at a weight ratio of 90:10. The dried silicon wafer was immersed in the resist image remover at 60 (° C.) for 10 (minutes). Thereafter, the silicon wafer was immersed in isopropanol at room temperature for 1 (minute), whereby the removing of the resist image was completed. Subsequently, the resulting silicon wafer was dried at 200 (° C.) for 30 (minutes) so as to remove the remaining solvents. When the polyimide film was observed, it bore a pattern conforming exactly to the photo-mask. Besides, no roughening of the surface of the resin, or thinning of the resin film, etc. noted that could be attributed to the resist image remover.

EXAMPLE 4

A varnish of N-methylpyrrolidone, being a polyimide, which was made from 2,2-bisphthalic hexafluoroisopropylidene dianhydride (6FDA) and 4,4'diamino-3,31,5,5'-tetraisopropyl diphenylmethane (IPDDM), was applied onto the semiconductor substrate (silicon wafer is used as the substrate) to a thickness of 10 ($\mu$m) by spin coating. Thereafter, it was dried at 120 (° C.) for 30 (minutes).

The negative type photoresist "OMR-85" mentioned before was applied onto the dried polyimide film to a thickness of 1 ($\mu$m) by spin coating. Thereafter, it was dried at 90 (° C.) for 20 (minutes) into a resist film.

The resist film was exposed to light with a photo-mask of linear pattern placed thereon. Subsequently, using a mixed solution which consisted of xylene and heptane, the etching of the resin film was carried out simultaneously with the development of the resist film. Thereafter, the resulting silicon wafer was dried at 140 (° C.) for 30 (minutes). A resist image remover was prepared by dissolving 0.5 parts-by-weight of para-toluenesulfonic acid into a mixed solution (solubility parameter: 8.6) in which cyclohexane and isopropanol were contained at a weight ratio of 90:10. The dried silicon wafer was immersed in the resist image remover at 60 (° C.) for 10 (minutes). Thereafter, the silicon wafer was immersed in isopropanol at room temperature for 1 (minute), whereby the removing of the resist image was completed. Subsequently, the resulting silicon wafer was dried at 200 (° C.) for 30 (minutes) so as to remove the remaining solvents. When the polyimide film was observed, it bore a pattern conforming exactly to the photo-mask. Besides, no roughening of the surface of the resin, or thinning of the resin film, etc. were noted that could be attributed to the resist image remover.

Comparative Example 1

The resin film pattern was formed on the semiconductor substrate (silicon wafer is used as the substrate), in the same way as in Example 1, except that xylene (solubility parameter: 8.8) not containing arylsulfonic acid was employed as a resist image remover. The resist image was not removed from the resin film.

Comparative Example 2

The resin film pattern was formed on the semiconductor substrate (silicon wafer is used as the substrate), in the same way as in Example 3, except that cyclohexane (solubility parameter: 8.3) not containing arylsulfonic acid was employed as a resist image remover. The resist image was not removed from the resin film.

Comparative Example 3

The resin film pattern was formed on the semiconductor substrate (silicon wafer is used as the substrate), in the same way as in Example 3, except that isopropanol (solubility parameter: 11.5) not containing arylsulfonic acid was employed as a resist image remover. The resist image was not removed from the resin film.

Comparative Example 4

The resin film pattern was formed on the semiconductor substrate (silicon wafer is used as the substrate), in the same way as in Example 1 except that isopropanol (solubility parameter: 11.5) containing 3 weight-% of para-toluenesulfonic acid was employed as a resist image remover, and that the temperature and the time period for the immersion of the silicon wafer were respectively set at 70 (° C.) and 20 (minutes). The resist image was not removed from the resin film.

The present invention thus far described is as defined in the appended claims, which bring forth effects stated below.

In accordance with the methods of claims disclosed, a resin film pattern can be formed on a semiconductor substrate by employing any of various resins soluble in organic solvents. Moreover, since the methods employ an organic solvent as an etchant (without employing any alkali), wiring is secure from corrosion.

A semiconductor chip and a semiconductor package have high reliabilities.

Resist image removers are new composites, owing to disclosed the methods are realized. Moreover, the resist image removers serve not only to form the resin film pattern on the semiconductor substrate, but also to form resin film patterns for the protection, insulation, etc. of the surfaces of the wiring of substrates for wiring boards, etc., or for bonding, etc.

What is claimed is:

1. A semiconductor chip, comprising, a semiconductor substrate;

a circuit formed on a surface of said semiconductor substrate; and a resin pattern of a desired pattern which is formed on said semiconductor substrate in order to partially cover said circuit, wherein:

said resin pattern is soluble in an organic solvent, wherein said resin pattern prevents roughening of a surface thereof or thinning of the resin pattern, wherein the resin pattern contains am arylsulfonic acid solution comprising 0.01–10.0 parts-by-weight of arylsulfonic acid to 100 parts-by-weight of solvent having a solubility parameter of 5.0–11.0.

2. A semiconductor chip according to claim 1, wherein:

said resin is any one selected from the group consisting of polyimide, polyamide, polysulfone, polyether sulfone, polyphenylene sulfide, polyetheretherketone and polylarylate.

3. A semiconductor package comprising:

the semiconductor chip as defined in claim 1, a lead frame and a mold resin, wherein:

said semiconductor chip has an electrode at a part of said circuit;
   said resin layer is of a pattern exposing said electrode;
   said lead frame is connected to said electrode; and
   said mold resin encapsulates at least said semiconductor chip and a connecting portion of the semiconductor chip and said lead frame.

* * * * *